(12) United States Patent
Oh et al.

(10) Patent No.: US 8,952,475 B2
(45) Date of Patent: Feb. 10, 2015

(54) PIXEL, PIXEL ARRAY, AND IMAGE SENSOR

(71) Applicant: Samsung Electronics Co., Ltd., Suwon-si, Gyeonggi-do (KR)

(72) Inventors: Min-seok Oh, Osan-si (KR); Eun-sub Shim, Anyang-si (KR); Jung-chak Ahn, Yongin-si (KR); Moo-sup Lim, Yongin-si (KR); Sung-ho Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/790,107

(22) Filed: Mar. 8, 2013

(65) Prior Publication Data

US 2013/0299934 A1    Nov. 14, 2013

(30) Foreign Application Priority Data

May 8, 2012  (KR) ........................ 10-2012-0048845

(51) Int. Cl.
 *H01L 31/062*   (2012.01)
 *H01L 31/00*    (2006.01)
 *H01L 27/146*   (2006.01)
 *H01L 31/0352*  (2006.01)

(52) U.S. Cl.
 CPC ...... *H01L 27/14645* (2013.01); *H01L 31/0352* (2013.01); *H01L 27/14603* (2013.01); *H01L 27/14612* (2013.01); *H01L 27/14641* (2013.01); *H01L 27/14621* (2013.01); *H01L 27/14627* (2013.01)
 USPC .... 257/440; 257/290; 257/292; 257/E27.133; 257/E27.135; 257/E27.142; 348/294; 348/308

(58) Field of Classification Search
 CPC ......... H04N 3/155; H04N 3/14; H04N 5/335; H04N 5/32; H04N 5/33; H01L 27/14603; H01L 27/14689; H01L 27/14609; H01L 27/14627; H01L 27/14645; H01L 31/035272
 USPC .......... 257/291, E27.131, E27.133, 440, 466, 257/290, 292, 59, 72, 432, E27.132, 257/E27.134, E27.135, E27.136, E27.138, 257/E27.142, E27.15; 438/294, E3.018; 348/302, 294, 308, E3.018, E5.001; 250/208.1
 See application file for complete search history.

(56) References Cited

U.S. PATENT DOCUMENTS

| | | | |
|---|---|---|---|
| 7,382,010 | B2 | 6/2008 | Choi |
| 7,671,314 | B2 | 3/2010 | Lee et al. |
| 2007/0090274 | A1 | 4/2007 | Lee et al. |
| 2007/0194356 | A1* | 8/2007 | Moon et al. ............... 257/291 |
| 2009/0295973 | A1* | 12/2009 | Oshikubo et al. ........... 348/311 |
| 2010/0245648 | A1 | 9/2010 | Tayanaka et al. |
| 2011/0024808 | A1* | 2/2011 | Janesick ................. 257/292 |
| 2011/0025892 | A1 | 2/2011 | Hibbeler et al. |
| 2011/0205417 | A1* | 8/2011 | Hynecek ................ 348/308 |
| 2012/0193516 | A1* | 8/2012 | Bogaerts ............... 250/208.1 |

FOREIGN PATENT DOCUMENTS

| | | | |
|---|---|---|---|
| JP | 2007-115994 A | | 5/2007 |
| JP | 2010-239074 A | | 10/2010 |
| KR | 10 2009-0125499 A | | 12/2009 |

OTHER PUBLICATIONS

Bogaerts, et al., CMOS image sensor with two-shared pixel and staggered readout architecture, CMOSIS, pp. 1-4; Belgium.

* cited by examiner

*Primary Examiner* — Chuong A Luu
*Assistant Examiner* — Moazzam Hossain
(74) *Attorney, Agent, or Firm* — Lee & Morse, P.C.

(57) ABSTRACT

A pixel and pixel array for use in an image sensor are provided. The image sensor includes floating sensing nodes symmetrically arranged with respect to a photodiode in each pixel.

20 Claims, 26 Drawing Sheets

FIG. 15A    FIG. 15B    FIG. 15C    FIG. 15D
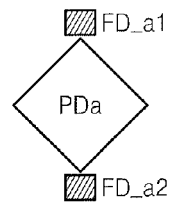 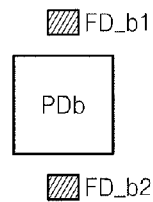 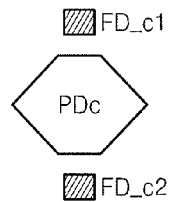 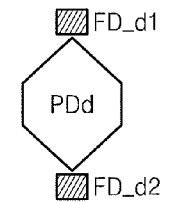
FIG. 15E    FIG. 15F    FIG. 15G    FIG. 15H
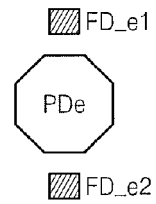 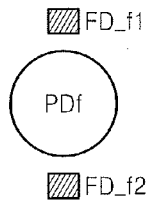 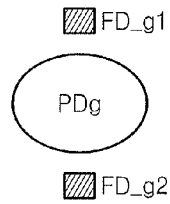 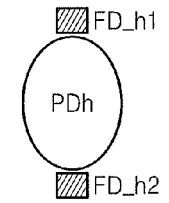

PIXEL, PIXEL ARRAY, AND IMAGE SENSOR

CROSS-REFERENCE TO RELATED APPLICATIONS

The present application claims priority under 35 U.S.C. §119 to Korean Patent Application No. 10-2012-0048845, filed on May 8, 2012, in the Korean Intellectual Property Office, and entitled: "Pixel, Pixel Array, and Image Sensor," which is incorporated by reference herein in its entirety.

BACKGROUND

1. Field

Embodiments relate to an image sensor, and more particularly, to a complementary metal oxide semiconductor (CMOS) image sensor for compensating for a difference in sensitivity in a particular color due to a difference in a chip ray angle (CRA) using opposing floating sensing nodes.

2. Description of the Related Art

A sensor including a pixel array, which senses effective physical quantity, such as light intensity, temperature, mass, or time, and outputs an electrical signal, is used in various areas. In particular, an image sensor measuring a captured image of an object is applied to various fields.

SUMMARY

One or more embodiments are directed to providing a pixel of an image sensor including a photodiode configured to convert an optical signal into photocharge, at least two sensing nodes configured to sense the photocharge and to be arranged symmetrically with respect to the photodiode in vicinity to the photodiode, and a driver configured to convert the photocharge into an electrical signal.

The pixel may further include a photo gate configured to apply a negative voltage to the photodiode when the photocharge is transferred from the photodiode to the at least two sensing nodes.

The photo gate may be placed to overlap the photodiode. The photo gate may be positioned in a path of light incident on the photodiode. Alternatively, the photo gate may be positioned off the path of light incident on the photodiode.

The driver may include at least two transfer transistors respectively adjacent to the at least two sensing nodes and the at least two transfer transistors may be on-off controlled simultaneously.

The driver may be disposed adjacent to each of at least two sides of the photodiode. The pixel may further include a reset element disposed adjacent to at least one side of the photodiode.

One or more embodiments are directed to providing a pixel array of an image sensor. The pixel array includes a first pixel disposed in a first row, the first pixel including a first photodiode and at least two first sensing nodes symmetrically disposed with respect to the first photodiode in the vicinity to opposite sides, respectively, of the first photodiode; and a second pixel disposed in a second row, the second pixel including a second photodiode and at least two second sensing nodes symmetrically disposed with respect to the second photodiode in the vicinity to opposite sides, respectively, of the second photodiode. The first pixel and the second pixel may be disposed adjacent to each other and may share at least one of the at least two first sensing nodes and the at least two second sensing nodes with each other.

The first pixel and the second pixel may be disposed in one column.

Each of the first pixel and the second pixel may include at least two drivers configured to convert charge received from the at least two first or second sensing nodes into an electrical signal. At least one of the at least two drivers may be shared by the first pixel and the second pixel.

Each of the first pixel and the second pixel may include a reset element configured to reset the at least two first or second sensing nodes. The first pixel and the second pixel may share the reset element with each other.

Each of the first pixel and the second pixel may be a color pixel including a luminance component. Each of the first pixel and the second pixel may include one of a green pixel and a white pixel. Each of the first pixel and the second pixel may be a pixel including a hue component.

One or more embodiments are directed to providing a pixel of an image sensor including a photodiode configured to convert an optical signal into photocharge, a photodiode configured to convert an optical signal into photocharge, at least two sensing nodes configured to sense the photocharge, the at least two sensing nodes being adjacent opposing portions of the photodiode, and a driver configured to convert the photocharge into an electrical signal.

The pixel may include insulating layers adjacent different opposing portions of the photodiode and between adjacent sensing nodes.

The photodiode may be a polygon and the opposing portions may be vertices or sides of the polygon.

The pixel may include a photo gate configured to apply a negative voltage to the photodiode when the photocharge is transferred from the photodiode to the at least two sensing nodes.

BRIEF DESCRIPTION OF THE DRAWINGS

Features will become apparent to those of ordinary skill in the art by describing in detail exemplary embodiments with reference to the attached drawings in which:

FIGS. 15A through 15H illustrate schematic diagrams of a pixel structure according to some embodiments of the inventive concept;

DETAILED DESCRIPTION

Figure 1:
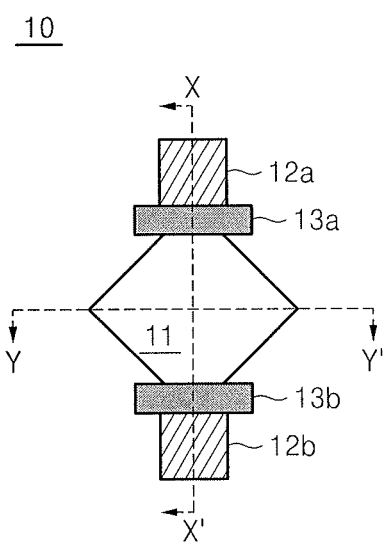
FIG. 1 illustrates a plan view of a photodiode and a floating sensing node in a unit pixel included in an image sensor according to some embodiments of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a plan view of a photodiode and a floating sensing node in a unit pixel 10 included in an image sensor according to some embodiments of the inventive concept.

Referring to FIG. 1, the pixel 10 includes a photodiode 11, transfer gates 13a and 13b respectively included in transfer transistors, and floating sensing nodes 12a and 12b.

Each of the transfer gates 13a and 13b may receive a gate control signal through a metal contact (not shown). Two transfer transistors may be formed using the transfer gates 13a and 13b, the photodiode 11 as a source or a drain, and the floating sensing nodes 12a and 12b each as the drain or the source.

Figure 2A:
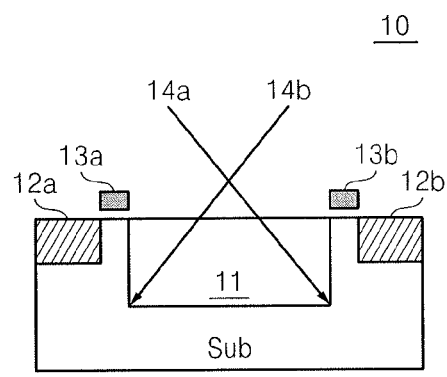
FIG. 2A illustrates a cross-sectional view of the pixel, taken along the line X-X' in FIG. 1 according to some embodiments of the inventive concept.
Figure 2B:
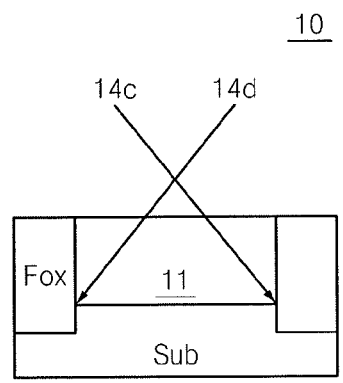
FIG. 2B illustrates a cross-sectional view of the pixel, taken along the line Y-Y' in FIG. 1 according to some embodiments of the inventive concept.

For instance, as shown in FIGS. 2A and 2B, one of the transfer transistors may include the transfer gate 13a, the photodiode 11 functioning as one of the source and the drain, and the floating sensing node 12a functioning as the other one of the source and the drain.

Each of the floating sensing nodes 12a and 12b may include a parasitic capacitor formed between one of the transfer transistors and a metal contact of a transistor including a driver (or an amplifier) (not shown) and/or a reset transistor.

The two floating sensing nodes 12a and 12b may be arranged adjacent opposing portions of the photodiode 11. For example, as illustrated in FIG. 1, the two floating sensing nodes 12a and 12b may be arranged symmetrically with respect to the photodiode 11. In the particular configuration illustrated in FIG. 1, the photodiode 11 is a square and the two floating sensing nodes 12a and 12b are arranged at vertices of the square.

The transfer gates 13a and 13b are respectively disposed between the photodiode 11 and the floating sensing nodes 12a and 12b. The transfer gates 13a and 13b are formed an electrically conductive material, e.g., metal, poly silicon, or a combination thereof.

The photodiode 11 may include a P-type doped region and an N-type doped region. When a substrate includes P-type impurities, the floating sensing nodes 12a and 12b may include N-type impurities. At this time, the transfer transistors may be N-type metal oxide semiconductor (NMOS) transistors.

FIGS. 2A and 2B illustrate cross-sectional views of the pixel 10, taken along the line X-X' and the line Y-Y', respectively, in FIG. 1. The pixel 10 is used for an image sensor in a front-side illumination sensor (FIS) structure.

Referring to FIG. 2A, the photodiode 11 is formed in a substrate Sub. The floating sensing nodes 12a and 12b are formed at both sides, respectively, of the photodiode 11 to be separated from the photodiode 11.

The floating sensing nodes 12a and 12b are disposed in symmetry with respect to the photodiode 11. The transfer gates 13a and 13b are respectively disposed between the photodiode 11 and the floating sensing nodes 12a and 12b. Photocharges generated in the photodiode 11 may be transferred to the floating sensing nodes 12a and 12b according to the turn-on operation of the respective transfer gates 13a and 13b.

Since the pixel 10 is in the FIS structure as described above, light beams 14c and 14b are incident on the front side of the substrate Sub. For instance, when the light beams 14a and 14b are incident to both bottom edges, respectively, of the photodiode 11 in the pixel 10, as shown in FIG. 2A, due to a chip ray angle (CRA) characteristic, sensitivity is the same in both directions to the floating sensing nodes 12a and 12b with respect to light having a long wavelength within a spectrum to be detected with a great depth of penetration since the floating sensing nodes 12a and 12b are arranged in symmetry. For example, when visible light is to be detected, a pixel in accordance with embodiments may accurately detect red light.

When both of the floating sensing nodes 12a and 12b are disposed at one side of the photodiode 11, light having a long wavelength penetrates up to the border between the photodiode 11 and each of the floating sensing nodes 12a and 12b. Since photocharges are generated depending on the light, a difference in photo sensitivity to light having a relatively long wavelength may occur as illumination or a pixel size decreases.

In contrast, when the floating sensing nodes 12a and 12b are disposed adjacent opposing portions of the photodiode 11, e.g., symmetrically with respect to the photodiode 11, as shown in FIG. 2A, differences in sensitivities for detection of light having a relatively long wavelength can be reduced.

Referring to FIG. 2B, insulating layers Fox (e.g., filed oxide layers) are disposed at both sides, respectively, of the photodiode 11. In particular, the insulating layer may be disposed in a direction orthogonal to the two floating sensing nodes 12a and 12b. For example, in the particular configuration illustrated in FIG. 1, the insulating layers Fox may be arranged at opposing vertices of the square, different from those where the two floating sensing nodes 12a and 12b are arranged. Light beams 14c and 14d are incident within the CRA. The insulating layers Fox may isolate the pixel 10 from adjacent pixels or electric conductivity patterns.

Figure 3A:
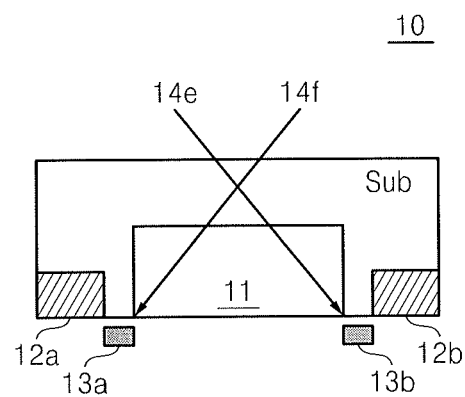
FIG. 3A illustrates a cross-sectional view of the pixel, taken along the line X-X' in FIG. 1 according to other embodiments of the inventive concept.
Figure 3B:
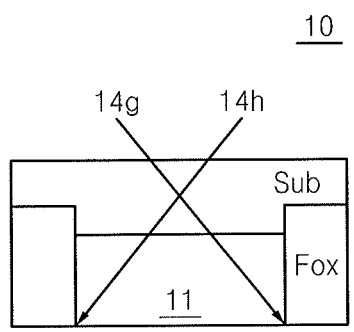
FIG. 3B illustrates a cross-sectional view of the pixel, taken along the line Y-Y' in FIG. 1 according to other embodiments of the inventive concept.

FIGS. 3A and 3B illustrate cross-sectional views of the pixel 10, taken along the line X-X' and the line Y-Y', respectively, in FIG. 1. The pixel 10 is used for an image sensor in a back-side illumination sensor (BIS) structure.

Referring to FIG. 3A, the photodiode 11 is formed in a substrate Sub. The floating sensing nodes 12a and 12b are formed at both sides, respectively, of the photodiode 11 to be separated from the photodiode 11. The floating sensing nodes 12a and 12b are symmetry with respect to the photodiode 11. The transfer gates 13a and 13b are respectively disposed between the photodiode 11 and the floating sensing nodes 12a and 12b.

Photocharges generated in the photodiode 11 may be transferred to the floating sensing nodes 12a and 12b based on the turn-on operation of the respective transfer gates 13a and 13b.

Since the pixel 10 illustrated in FIG. 3A is in the BIS structure as described above, light beams 14e and 14f are incident on the back side of the substrate Sub.

For instance, when the light beams 14e and 14f are incident to both bottom edges, respectively, of the photodiode 11 in the pixel 10, as shown in FIG. 3A, due to the CRA characteristic, sensitivity to longer wavelengths, e.g., red light in the visible spectrum, with a great depth of penetration may be constant regardless of the position of the pixel 10 as compared to a case where the floating sensing nodes 12a and 12b are both disposed at one side.

Referring to FIG. 3B, insulating layers Fox are disposed at both sides, respectively, of the photodiode 11. Light beams 14g and 14h are incident within the CRA. The insulating layers Fox may isolate the pixel 10 from adjacent pixels or electric conductivity patterns.

Figure 4:
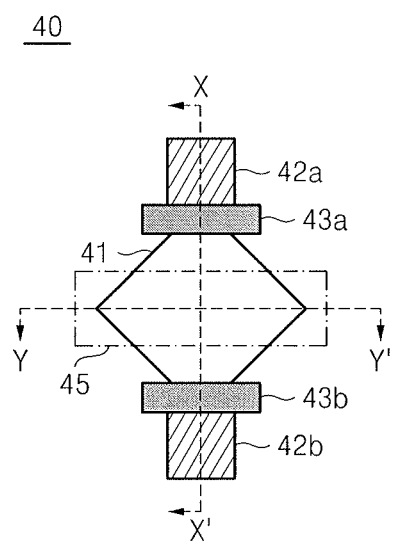
FIG. 4 illustrates a plan view of a photodiode and a floating sensing node in a unit pixel included in an image sensor according to other embodiments of the inventive concept.

FIG. 4 illustrates a plan view of a photodiode and a floating sensing node in a unit pixel 40 included in an image sensor according to other embodiments of the inventive concept. Referring to FIG. 4, the pixel 40 includes a photodiode 41, transfer gates 43a and 43b respectively included in transfer transistors, and floating sensing nodes 42a and 42b. A photo gate 45 formed of a material that transmits light and has conductivity is disposed on the photodiode 41. The photo gate 45 may be disposed in an optical path of light incident on the photodiode 41 or in a direction different than the optical path.

The photo gate 45 may include a conductive material, such as indium tin oxide (ITO), which transmits, e.g., fully transmits, light at wavelengths to be detected by the photodiode 41. For example, when light photoelectrically converted in the photodiode 41 is in a range of visible wavelengths, the photo gate 45 may include a material that selectively transmits only light in the range of visible wavelengths and has conductivity.

When photocharge in the photodiode 41 is transferred to the floating sensing nodes 42a and 42b through the on/off control on the transfer gates 43a and 43b, a negative voltage is applied to the photo gate 45, so that photocharge transfer efficiency can be increased. Here, apart from the photo gate 45 and reference numerals, the structure and the operations of the pixel 40 illustrated in FIG. 4 are substantially same as those of the pixel 10 illustrated in FIG. 1. Thus, detailed descriptions of the structure and the operations of the pixel 40 will be omitted.

Figure 5A:
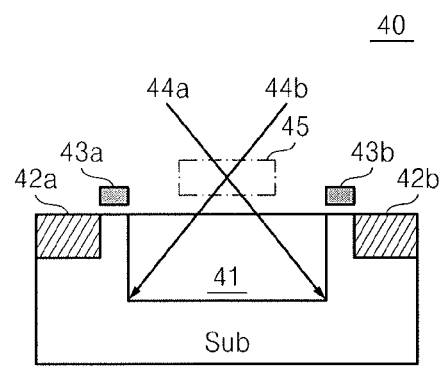
FIG. 5A illustrates a cross-sectional view of the pixel, taken along the line X-X' in FIG. 4 according to some embodiments of the inventive concept.
Figure 5B:
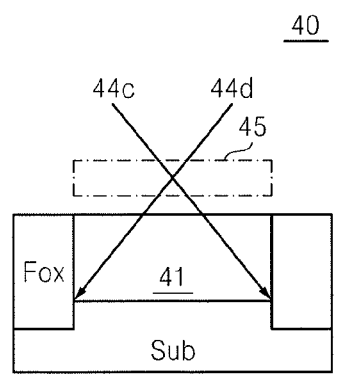
FIG. 5B illustrates a cross-sectional view of the pixel, taken along the line Y-Y' in FIG. 4 according to some embodiments of the inventive concept.

FIGS. 5A and 5B illustrate cross-sectional views of the pixel 40, taken along the line X-X' and the line Y-Y', respectively, in FIG. 4. The pixel 40 is used for an image sensor in the FIS structure.

Referring to FIG. 5A, the photodiode 41 is formed in a substrate Sub. The floating sensing nodes 42a and 42b are disposed at both sides, respectively, of the photodiode 41 to be separated from the photodiode 41. The floating sensing nodes 42a and 42b are disposed in symmetry with respect to the photodiode 41.

The transfer gates 43a and 43b are respectively disposed between the photodiode 41 and the floating sensing nodes 42a and 42b. The photo gate 45 is disposed on the photodiode 41, and therefore, when photocharge generated in the photodiode 41 is transferred to the floating sensing nodes 42a and 42b, a negative voltage is applied to the photo gate 45.

Since the pixel 40 is in the FIS structure as described above, light beams 44a and 44b are incident on the photodiode 41 through the photo gate 45. The photo gate 45 may have a property of transmitting light to be photoelectrically converted in the photodiode 41. For instance, when the photodiode 41 is used for an image sensor, the photo gate 45 requires a property of transmitting light in the range of visible wavelengths. When the photodiode 41 is used for a depth measuring sensor, the photo gate 45 requires a property of transmitting a laser beam or light emitting diode (LED) light used to measure a distance.

As described above, when the photo gate 45 exerts an influence on optical transmission property besides the usage for receiving negative voltage, the photo gate 45 may be formed to blanket the photodiode 41.

Referring to FIG. 5B, insulating layers Fox are disposed at both sides, respectively, of the photodiode 41. Light beams 44c and 44d are incident within the CRA. The insulating layers Fox may isolate the pixel 40 from adjacent pixels or electric conductivity patterns.

Figure 6:
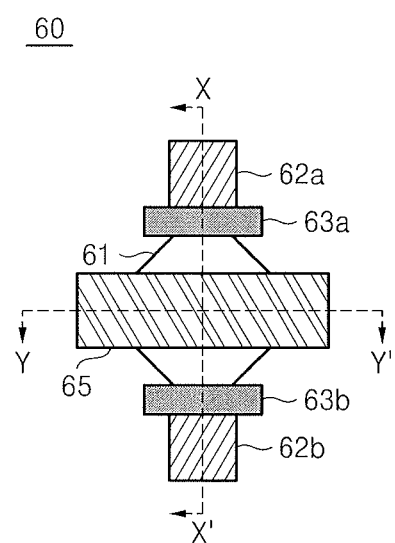
FIG. 6 illustrates a plan view of a photodiode and a floating sensing node in a unit pixel included in an image sensor according to further embodiments of the inventive concept;
}

FIG. 6 illustrates a plan view of a photodiode and a floating sensing node in a unit pixel 60 included in an image sensor according to further embodiments of the inventive concept. Referring to FIG. 6, the pixel 60 includes a photodiode 61, transfer gates 63a and 63b respectively included in transfer transistors, and floating sensing nodes 62a and 62b.

A photo gate 65 formed of a conductive material is disposed on the photodiode 61. Although the photo gate 65 is illustrated to be disposed above the photodiode 61, since the pixel 60 is used in an image sensor in the BIS structure, the photo gate 65 will be positioned below the photodiode 61 in a physical structure.

When photocharge in the photodiode 61 is transferred to the floating sensing nodes 62a and 62b through the on/off control on the transfer gates 63a and 63b, a negative voltage is applied to the photo gate 65, so that photocharge transfer efficiency can be increased.

Apart from the photo gate 65 and reference numerals, the structure and the operations of the pixel 60 are substantially same as those of the pixel 10 illustrated in FIG. 1 or the pixel 40 illustrated in FIG. 4. Thus, detailed descriptions of the structure and the operations of the pixel 60 will be omitted.

Figure 7A:
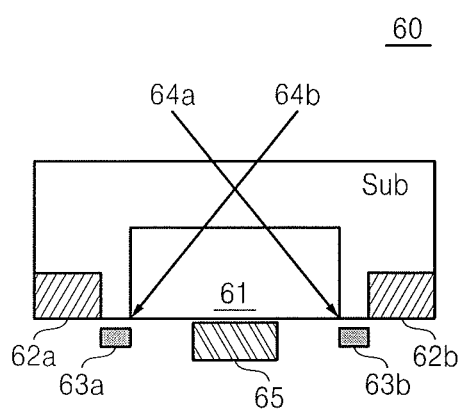
FIG. 7A illustrates a cross-sectional view of the pixel, taken along the line X-X' in FIG. 6 according to some embodiments of the inventive concept.
Figure 7B:
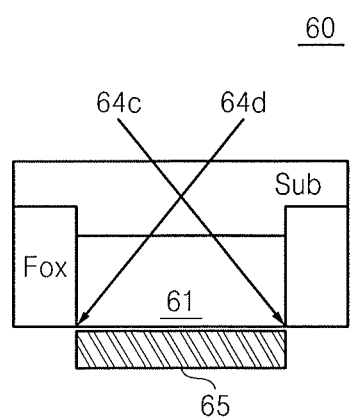
FIG. 7B illustrates a cross-sectional view of the pixel, taken along the line Y-Y' in FIG. 6 according to some embodiments of the inventive concept.

FIGS. 7A and 7B illustrate cross-sectional views of the pixel 60, taken along the line X-X' and the line Y-Y' respectively, in FIG. 6. The pixel 60 is used for an image sensor in the BIS structure.

Referring to FIG. 7A, the photodiode 61 is formed in a substrate Sub. The floating sensing nodes 62a and 62b are disposed at both sides, respectively, of the photodiode 61 and are separated from the photodiode 61. As illustrated in FIGS. 6-7B, the floating sensing nodes 62a and 62b are disposed symmetrically with respect to the photodiode 61.

The transfer gates 63a and 63b are respectively disposed between the photodiode 61 and the floating sensing nodes 62a and 62b. The photo gate 65 is disposed below the photodiode 61, and therefore, when photocharge generated in the photodiode 61 is transferred to the floating sensing nodes 62a and 62b, a negative voltage is applied to the photo gate 65.

Since the pixel 60 illustrated in FIGS. 6 and 7A is in the FIS structure as described above, light beams 64a and 64b are incident on the photodiode 61 through the side opposite to the photo gate 65, i.e., the back side of the substrate Sub. A filter (not shown) transmitting light to be photoelectrically converted by the photodiode 61 may be added to the back side of the substrate Sub.

When visible light is to be photoelectrically converted, the pixel 60 may include a conductive material that selectively transmits only visible light. The visible light may include light of particular colors, e.g., red (R), blue (B), green (G), white (W), magenta (Mg), cyan (Cy), or yellow (Y). Here, white light refers to the visible light provided to a pixel that does not include the color filter.

Referring to FIG. 7B, insulating layers Fox are disposed at both sides, respectively, of the photodiode 61. Light beams 64c and 64d are incident within the CRA. The insulating layers Fox may isolate the pixel 60 from adjacent pixels or electric conductivity patterns.

Figure 8:
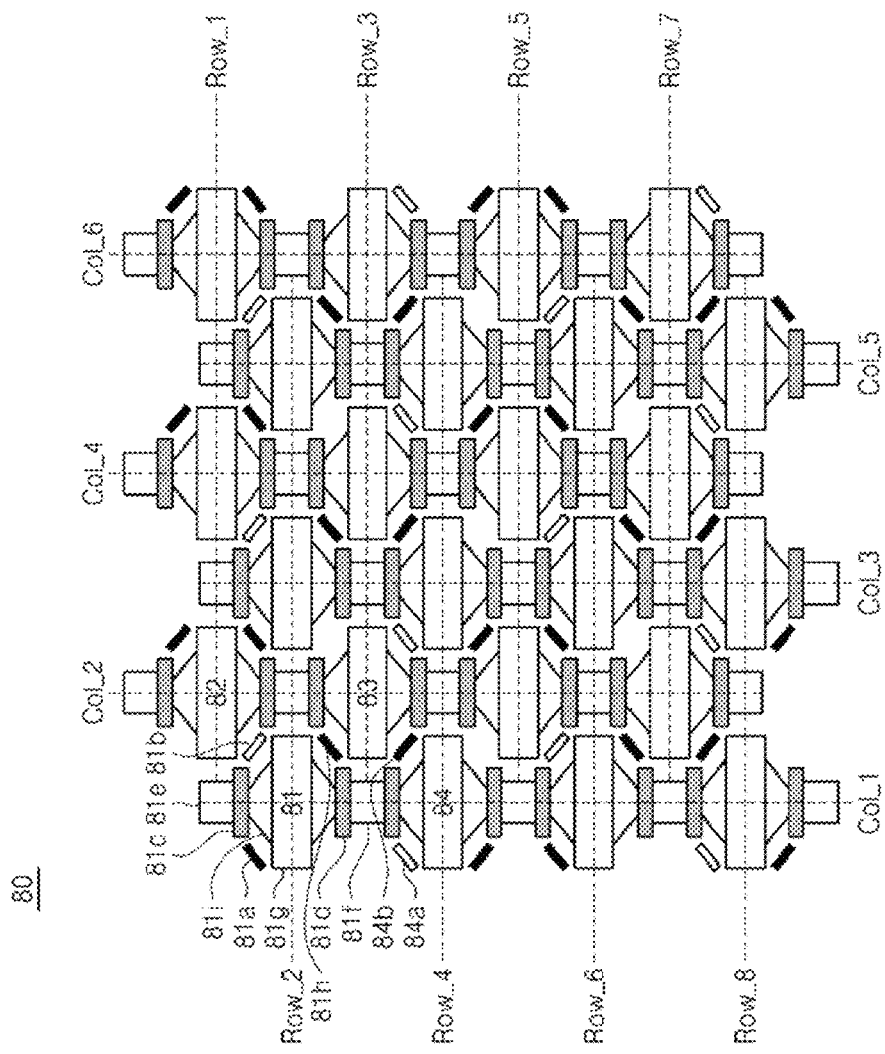
FIGS. 8 and 9 illustrate plan views of a pixel array including a unit pixel.

FIG. 8 illustrates a plan view of a pixel array 80 including a pixel. Referring to FIG. 8, pixels 81, 82, 83, and 84 having the same structure as the pixel 60 illustrated in FIG. 6 are regularly arranged to form the pixel array 80.

Pixels are regularly arranged in rows Row_1 through Row_8 and columns Col_1 through Col_6 in the pixel array 80 and are alternately arranged in adjacent rows or columns. This alternating pixel arrangement is used for floating sensing nodes disposed in symmetry with respect to a photodiode and the efficient operation thereof. The structure of the pixel 81 will be described in detail. The pixel 81 is in the BIS structure. A negative voltage is applied to a photo gate 81g in order to increase the photocharge transfer efficiency of a photodiode 81i.

The pixel 81 includes the photodiode 81i, floating sensing nodes 81e and 81f disposed symmetrically with respect to the photodiode 81i, and transfer gates 81c and 81d respectively disposed between the photodiode 81i and the floating sensing nodes 81e and 81f.

The photo gate 81g is disposed below the substrate of the photodiode 81i. Two drivers 81a and 81h and a reset element 81b are disposed at sides of the pixel 81 corresponding to sides of the photodiode 81i. Here, the pixel 81 has four sides apart from sides respectively adjacent to the floating sensing nodes 81e and 81f. Of those four sides, two sides are respectively adjacent to the drivers 81a and 81h and one side is adjacent to the reset element 81b.

The floating sensing nodes 81e and 81f are shared by pixels adjacent in a column. Accordingly, although not shown, the driver 81a and the reset element 81b are shared by pixels in the column Col_1 in which the pixel 81 is implemented. In the same manner, the floating sensing node 81f, the driver 84b, and the reset element 84a are shared by the pixels 81 and 84 in the column Col_1.

The positions of the driver 81h and the reset element 81b may be different with respect to the pixels 82 and 83 in the column Col_2 than with respect to the pixels 81 and 84 in the column Col_1. This will be described in detail with reference to FIG. 10 later.

Figure 9:
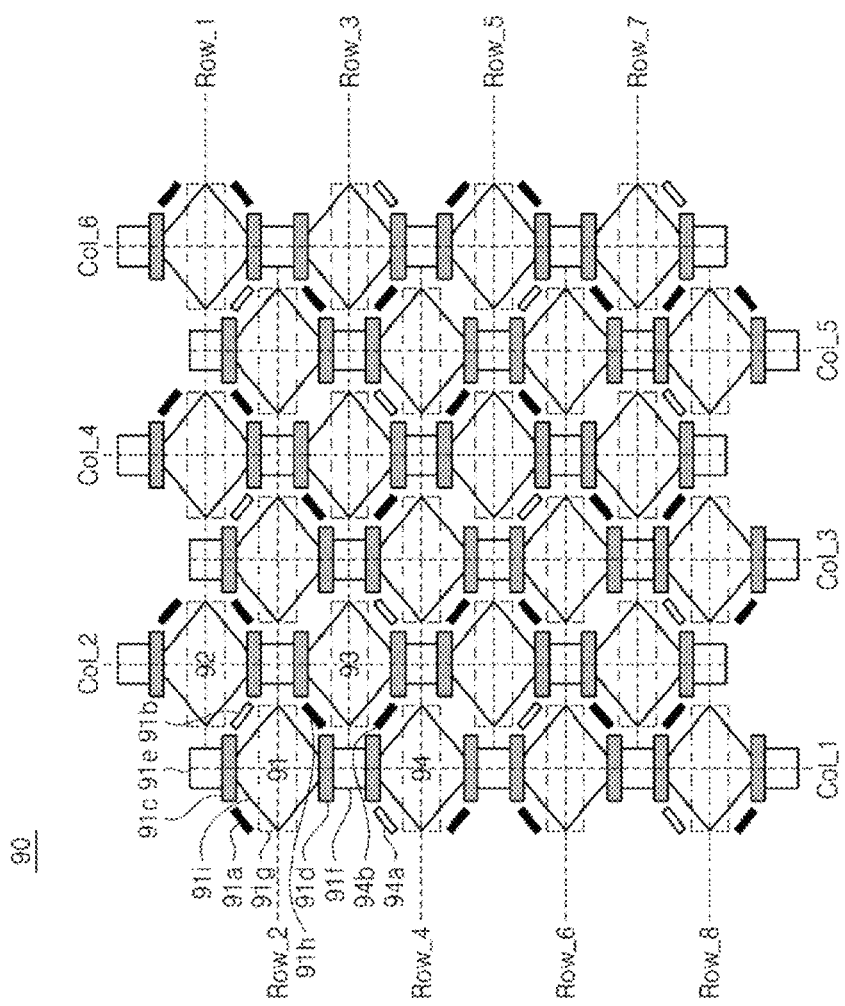

FIG. 9 illustrates a plan view of a pixel array 90 including a unit pixel. Referring to FIG. 9, like in the pixel array 80 illustrated in FIG. 8, pixels 91, 92, 93, and 94 are regularly arranged to form the pixel array 90. Pixels are regularly arranged in rows Row_1 through Row_8 and columns Col_1 through Col_6 in the pixel array 90 and are alternately arranged in adjacent rows or columns.

The structure of the pixel array 90 illustrated in FIG. 9 is different from that of the pixel array 80 illustrated in FIG. 8 in that a photo gate 91g is formed of a transparent electrode material such as ITO. Accordingly, even when the photo gate 91g is disposed on or above the photo diode 91i, it does not substantially influence the incidence of light. Therefore, the pixel array 90 illustrated in FIG. 9 may be applied to an image sensor using the FIS structure.

The pixel array 90 including the photo gate 91g formed of a transparent electrode material may be applied to the BIS structure as well. Apart from the photo gate 91g and reference numerals, the structure of the pixel array 90 is the same as that of the pixel array 80 illustrated in FIG. 8. Thus, detailed descriptions of the structure and the operations of the pixel array 90 will be omitted.

Figure 10:
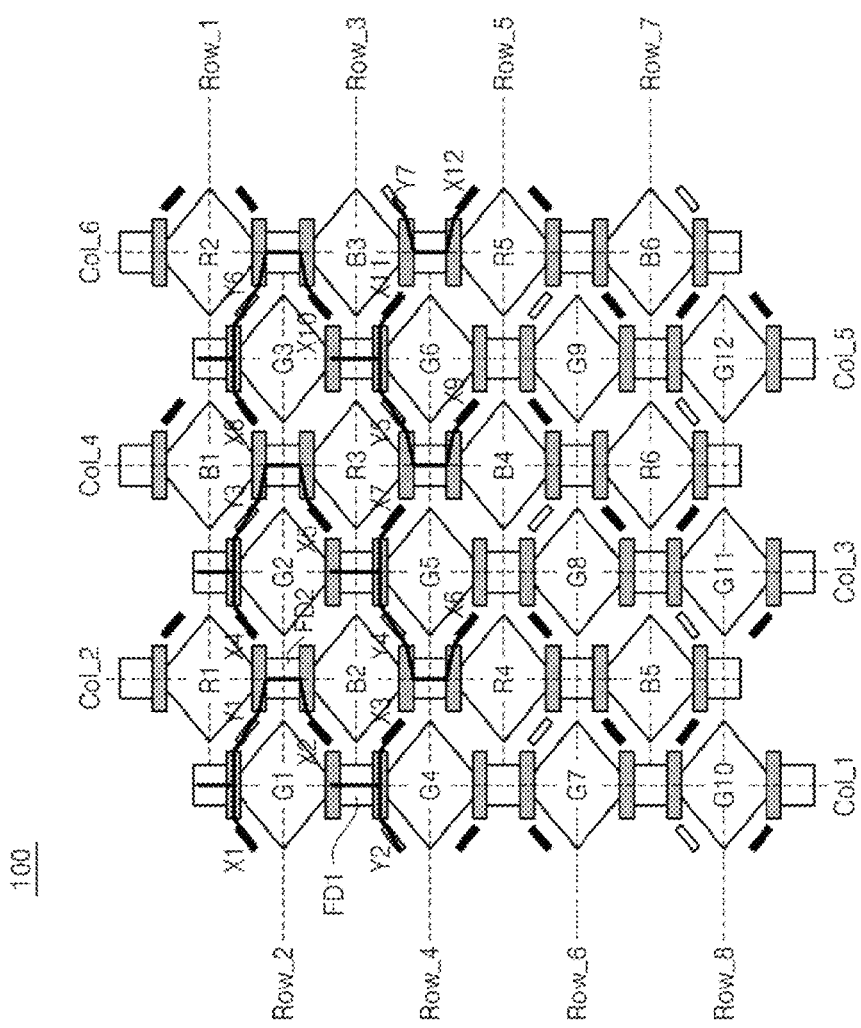
FIG. 10 illustrates a diagram of a pixel array of an image sensor with a Bayer pattern according to some embodiments of the inventive concept.

FIG. 10 illustrates a diagram of a pixel array 100 of an image sensor with a Bayer pattern according to some embodiments of the inventive concept. Referring to FIG. 10, a Bayer pattern including two G pixels, one R pixel, and one B pixel in mosaic is repeated in the pixel array 100. Unlike the pixel array 90 illustrated in FIG. 9, the pixel array 100 illustrated in FIG. 10 does not include the photo gate 91g and each pixel is implemented as a G pixel, an R pixel, or a B pixel.

G pixels G1 through G12 are arranged in odd-numbered columns Col_1, Col_3, and Col_5. Here, G pixels G1 through G12 in a column are arranged to be adjacent above and below and share a floating sensing node, one of drivers X1 through X12, and one of reset elements Y1 through Y7. For instance, the two G pixels G1 and G4 adjacent above and below share a floating sensing node FD1, a driver X3, and a reset element Y2 with each other.

B pixels B1 through B6 and R pixels R1 and R6 are alternately arranged in even-numbered columns Col_2, Col_4, and Col_6. One of the B pixels B1 through B6 and one of the R pixels R1 and R6 are adjacent above and below and share a floating sensing node, a driver, and a reset element. For instance, the R pixel R1 and the B pixel B2 adjacent above and below share a floating sensing node FD2, a driver X2, and a reset element Y1 with each other.

The structure of the pixel array 100 has been described above on the basis of a column, but it may also be described on the basis of a row. In detail, the R pixels R1 and R6 and the B pixels B1 through B6 may be arranged in odd-numbered rows Row_1, Row_3, Row_5, and Row_7, while the G pixels G1 through G12 may be arranged in even-numbered rows Row_2, Row_4, Row_6, and Row_8.

Figure 11:
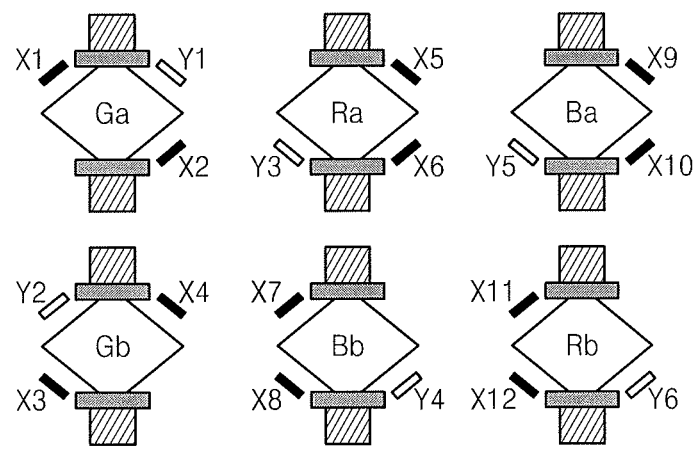
FIG. 11 illustrates a schematic diagram of some pixels included in the pixel array illustrated in FIG. 10.

FIG. 11 illustrates a schematic diagram of some pixels included in the pixel array 100 illustrated in FIG. 10. Referring to FIG. 11, six color pixels Ga, Gb, Ra, Rb, Ba, and Bb are illustrated. A photodiode included in each of the color pixels Ga, Gb, Ra, Rb, Ba, and Bb has four sides in total. At three sides of four sides of each of the color pixels Ga, Gb, Ra, Rb, Ba, and Bb are disposed in vicinity two drivers X1 and X2, X3 and X4, X5 and X6, X11 and X12, X9 and X10, or X7 and X8 and one reset element Y1, Y2, Y3, Y6, Y5, or Y4.

In detail, each of the color pixels Ga, Gb, Ra, Rb, Ba, and Bb includes two drivers X1 and X2, X3 and X4, X5 and X6, X11 and X12, X9 and X10, or X7 and X9 and one reset element Y1, Y2, Y3, Y6, Y5, or Y4. One of the two drivers X1 and X2, X3 and X4, X5 and X6, X11 and X12, X9 and X10, or X7 and X8 included in a current pixel is shared with an adjacent pixel with which the current pixel share a floating sensing node, while the other one is used by another adjacent pixel with which the current pixel does not share the floating sensing node. The reset element Y1, Y2, Y3, Y6, Y5, or Y4 operates through the floating sensing node of the current pixel.

In the embodiments illustrated in FIGS. 8 through 10, each photodiode has four sides in total and has two drivers and one reset element respectively disposed in vicinity to three of the four sides and has one side empty. However, the empty side may be filled with a dummy pattern, may be used to extend a driver, or may be used to implement an additional element, e.g., a capacitor or a transistor, to extend a dynamic range or a global shutter.

The drivers X1 through X12 may convert photocharge sensed using a floating sensing node into an electrical signal and amplify and output the electrical signal. The reset elements Y1 through Y6 may reset photocharge in a floating sensing node (for example, to a power supply voltage).

For instance, in a correlated double sampling (CDS) mode used in an image sensor, a reset value of a floating sensing node is read first, then a data sensing value is read, and then a difference between two values is calculated, in order to reduce fixed pattern noise (FPN). The reset elements Y1 through Y6 are used for a reset operation in the CDS mode.

Figure 12:
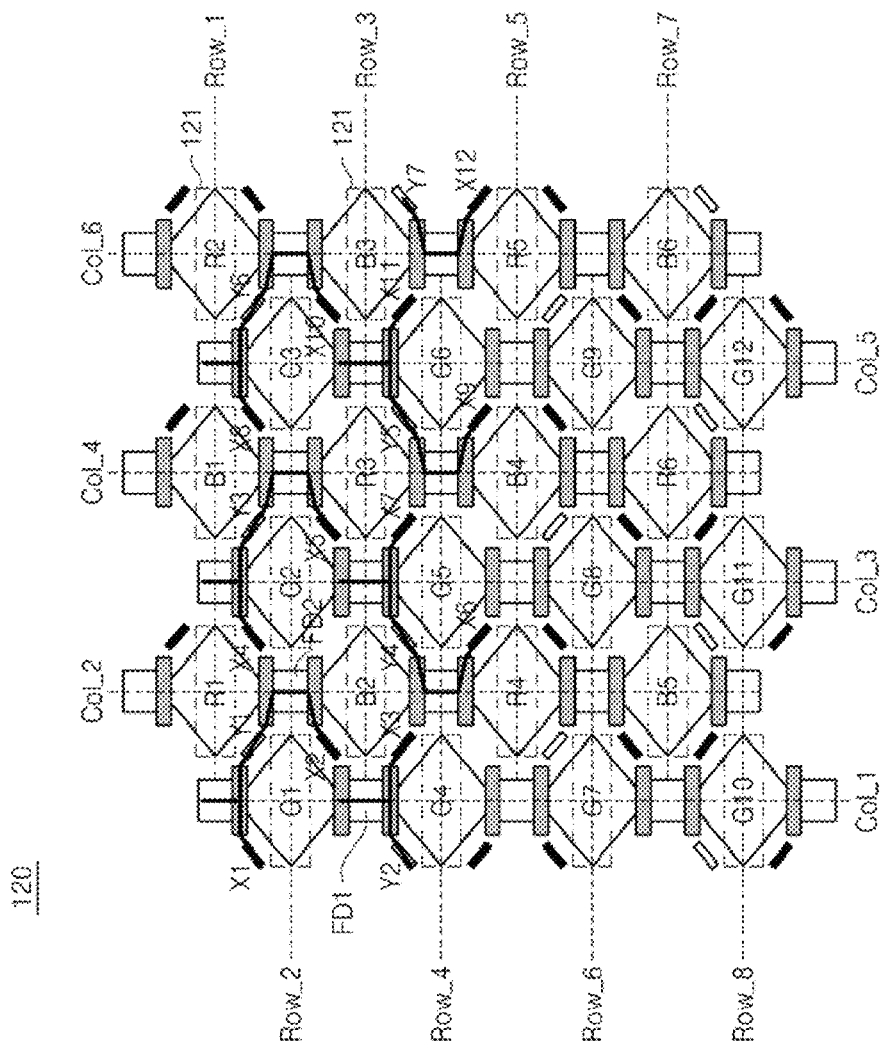
FIG. 12 illustrates a diagram of a pixel array of an image sensor having a structure in which a photo gate is added to the pixel array illustrated in FIG. 10.

FIG. 12 illustrates a diagram of a pixel array 120 of an image sensor having a structure in which a photo gate is added to the pixel array 100 illustrated in FIG. 10. The pixel array 120 illustrated in FIG. 12 is substantially the same as the pixel array 100 illustrated in FIG. 10 with the exception that a photo gate 121 is additionally disposed on or above a photodiode of each pixel. The photo gate 121 may be formed of a transparent electrode material such as ITO and disposed on or above a photodiode. The pixel array 120 may be used for an image sensor in the FIS structure.

In other embodiments, the photo gate 121 may be disposed under or below the photodiode, i.e., under or below a substrate. A pixel array having this structure may be used for an image sensor in the BIS structure.

Figure 13:
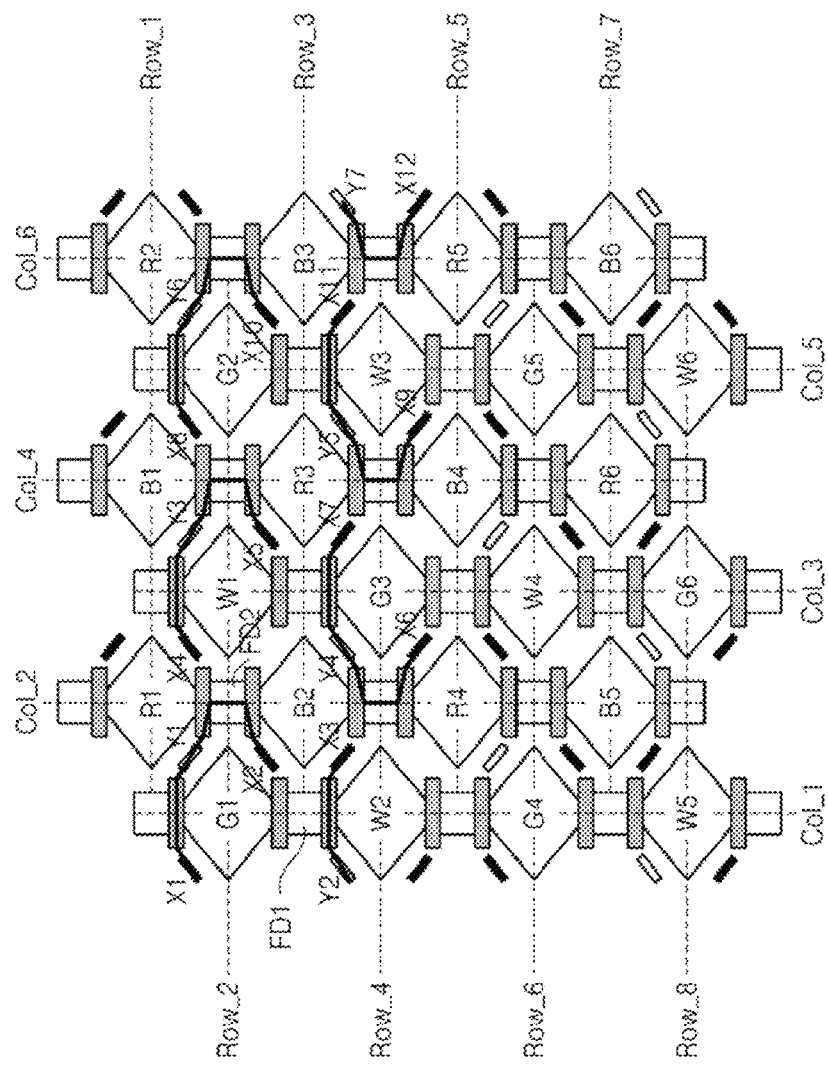
FIG. 13 illustrates a diagram of a pixel array of an image sensor with a WRGB pattern according to some embodiments of the inventive concept.

FIG. 13 illustrates a diagram of a pixel array 130 of an image sensor with a WRGB pattern according to some embodiments of the inventive concept. Referring to FIG. 13, a WRGB pattern including a W pixel, a G pixel, an R pixel, and a B pixel in mosaic is repeated in the pixel array 130. When the pixel array 130 illustrated in FIG. 13 is compared with the pixel array 100 with the Bayer pattern in FIG. 10, one of two G pixels in the Bayer pattern is replaced with the W pixel.

The G pixels G1 through G6 and W pixels W1 through W6 are alternately arranged in the odd-numbered columns Col_1, Col_3, and Col_5. One of the G pixels G1 through G6 and one of the W pixels W1 through W6 are adjacent above and below in one of the columns Col_1, Col_3, and Col_5 and share a floating sensing node, one of the drivers X1 through X12, and one of the reset elements Y1 through Y7. For instance, the G pixel G1 and the W pixel W2 adjacent above and below share the floating sensing node FD1, the driver X3, and the reset element Y2, which are disposed between the pixels G1 and W2, with each other.

The B pixels B1 through B6 and the R pixels R1 and R6 are arranged in the even-numbered columns Col_2, Col_4, and Col_6. One of the B pixels B1 through B6 and one of the R pixels R1 and R6 are adjacent above and below and share a floating sensing node, one of the drivers X1 through X12, and one of the reset elements Y1 through Y7. For instance, the R pixel R1 and the B pixel B2 adjacent above and below share the floating sensing node FD2, the driver X2, and the reset element Y1, which are disposed between the pixels R1 and R2, with each other.

When structure of the pixel array 130 is described on the basis of a row, the R pixels R1 and R6 and the B pixels B1 through B6 are arranged in the odd-numbered rows Row_1, Row_3, Row_5, and Row_7; and the G pixels G1 through G6 and the W pixels W1 through W6 are arranged in the even-numbered rows Row_2, Row_4, Row_6, and Row_8.

Figure 14:
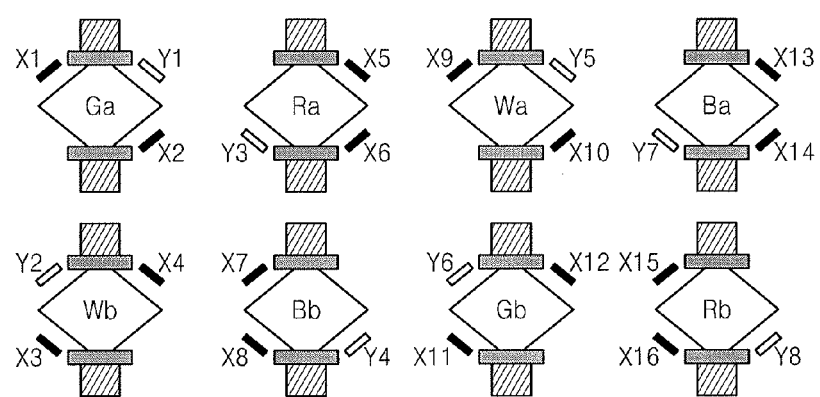
FIG. 14 illustrates a schematic diagram of some pixels included in the pixel array illustrated in FIG. 13.

FIG. 14 illustrates a schematic diagram of some pixels included in the pixel array 130 illustrated in FIG. 13. Referring to FIG. 14, eight color pixels Ga, Gb, Ra, Rb, Ba, Bb, Wa and Wb are illustrated. A photodiode included in each of the color pixels Ga, Gb, Ra, Rb, Ba, Bb, Wa and Wb has four sides in total. At three sides of the four sides are disposed in vicinity two of the drivers X1 through X16 and one of the reset elements Y1 through Y8.

In detail, each of the color pixels Ga, Gb, Ra, Rb, Ba, Bb, Wa and Wb includes two drivers X1 and X2, X11 and X12, X5 and X6, X15 and X16, X13 and X14, X7 and X8, X9 and X10, or X3 and X4 and one reset element Y1, Y6, Y3, Y8, Y7, Y4, Y5, or Y2. One of the two drivers X1 and X2, X11 and X12, X5 and X6, X15 and X16, X13 and X14, X7 and X8, X9 and X10, or X3 and X4 included in a current pixel is shared with an adjacent pixel with which the current pixel share a floating sensing node, while the other one is used by another adjacent pixel with which the current pixel does not share the floating sensing node. The reset element Y1, Y6, Y3, Y8, Y7, Y4, Y5, or Y2 operates through the floating sensing node of the current pixel.

The structure illustrated in FIG. 14 is substantially the same as the structure illustrated in FIG. 11 with the exception that the W pixels Wa and Wb are additionally provided. Thus, detailed descriptions of the structure and the operation of the structure illustrated in FIG. 14 will be omitted.

FIGS. 15A through 15H illustrate schematic diagrams of a pixel structure according to some embodiments of the inventive concept. FIGS. 15A through 15H show eight different shapes of a photodiode. For convenience, only photodiodes PDa through PDh and floating sensing nodes FD_a1 through FD_h2 are illustrated.

Referring to FIG. 15A, the photodiode PDa has a quadrilateral (i.e., diamond) shape. Floating sensing nodes FD_a1 and FD_a2 are disposed adjacent two facing vertices, respectively, of the photodiode PDa. Referring to FIG. 15B, the photodiode PDb has a quadrilateral (i.e., square or rectangular) shape. Floating sensing nodes FD_b1 and FD_b2 are disposed adjacent two facing sides, respectively, of the photodiode PDb.

Referring to FIG. 15C, the photodiode PDc has a hexagonal shape. Floating sensing nodes FD_c1 and FD_c2 are disposed adjacent two facing sides, respectively, of the photodiode PDc. Referring to FIG. 15D, the photodiode PDd has a hexagonal shape. Floating sensing nodes FD_d1 and FD_d2 are disposed adjacent two facing vertices, respectively, of the photodiode PDd.

Referring to FIG. 15E, the photodiode PDe has an octagonal shape. Floating sensing nodes FD_e1 and FD_e2 are disposed adjacent two facing sides, respectively, of the photodiode PDe. Referring to FIG. 15F, the photodiode PDf has a circular shape. Floating sensing nodes FD_f1 and FD_f2 are disposed adjacent two facing portions, respectively, of the photodiode PDf.

Referring to FIG. 15G, the photodiode PDg is an ellipse. Floating sensing nodes FD_g1 and FD_g2 are disposed adjacent two facing portions, respectively, of the photodiode PDg along the minor axis. Referring to FIG. 15H, the photodiode PDh has an oval shape. Floating sensing nodes FD_h1 and FD_h2 are disposed adjacent two facing portions, respectively, of the photodiode PDh along the major axis.

Figure 16:
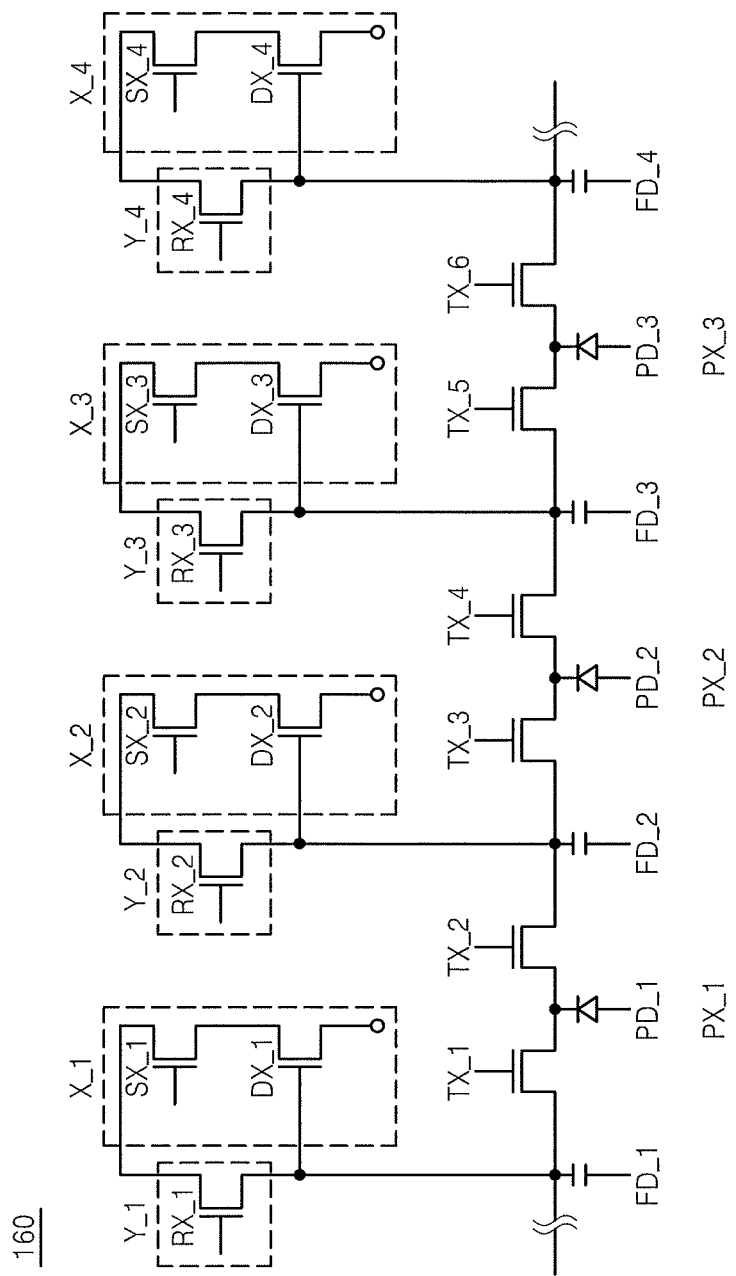
FIG. 16 illustrates a schematic circuit diagram of a pixel array according to some embodiments of the inventive concept.

FIG. 16 illustrates a schematic circuit diagram of a pixel array 160 according to some embodiments of the inventive concept. Referring to FIG. 16, the pixel array 160 includes three pixels PX_1 through PX_3 adjacent to one another. Each of the pixels PX_1 through PX_3 include one of photodiodes PD_1 through PD_3; two floating sensing nodes FD_1 and FD_2, FD_2 and FD_3, or FD_3 and FD_4 arranged in symmetry; and transfer transistors TX_1 and TX_2, TX_3 and TX_4, or TX_5 and TX_6 respectively placed between the photodiode PD_1, PD_2, or PD_3 and the two floating sensing nodes FD_1 and FD_2, FD_2 and FD_3, or FD_3 and FD_4.

The pixel array 160 also includes four reset elements Y_1 through Y_4 and four drivers X_1 through X_4. Each of the reset elements Y_1 through Y_4 is paired with each of the drivers X_1 through X_4. Here, each pair may be referred to as a driver. Each driver-reset element pair and the floating sensing node FD_1, FD_2, FD_3, or FD_4 connected to the pair are shared by two adjacent pixels.

The pixels PX_1 and PX_2 share the driver X_2, the reset element Y_2, and the floating sensing node FD_2. The pixels PX_2 and PX_3 share the driver X_3, the reset element Y_3, and the floating sensing node FD_3.

The structure of the reset element Y_1 is the same as that of the reset elements Y_2 through Y_4. The structure of the driver X_1 is the same as that of the drivers X_2 through X_4.

The reset element Y_1 includes a reset transistor RX_1. The reset transistor RX_1 has a gate controlled by a reset signal (not shown), a source connected to the floating sensing node FD_1, and a drain connected to a voltage supply terminal. The drain of the reset transistor RX_1 may be connected to a fixed or variable power supply voltage terminal.

The driver X_1 includes a select transistor SX_1 and a drive transistor DX_1. The select transistor SX_1 has a gate controlled by a selection signal (not shown) and a drain connected to the voltage supply terminal. The drive transistor DX_1 has a gate connected in common to the source of the reset transistor RX_1 through the floating sensing node FD_1 and a drain connected to a source of the select transistor SX_1.

Alternatively, the select transistor SX_1 may be connected between a source of the drive transistor DX_1 and a ground voltage terminal. Here, a voltage at the ground voltage terminal may be variable.

Figure 17:
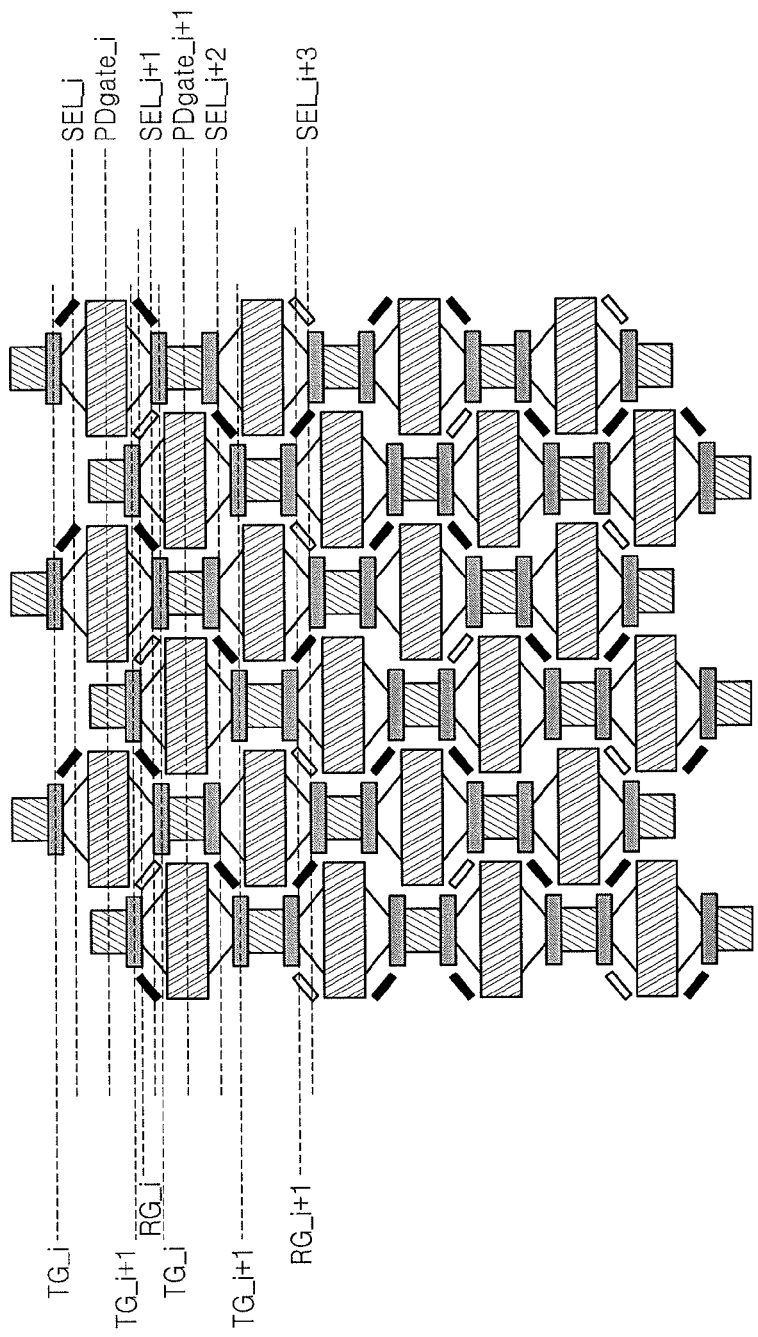
FIG. 17 illustrates a diagram for explaining the operation of the pixel array illustrated in FIG. 8.
Figure 18:
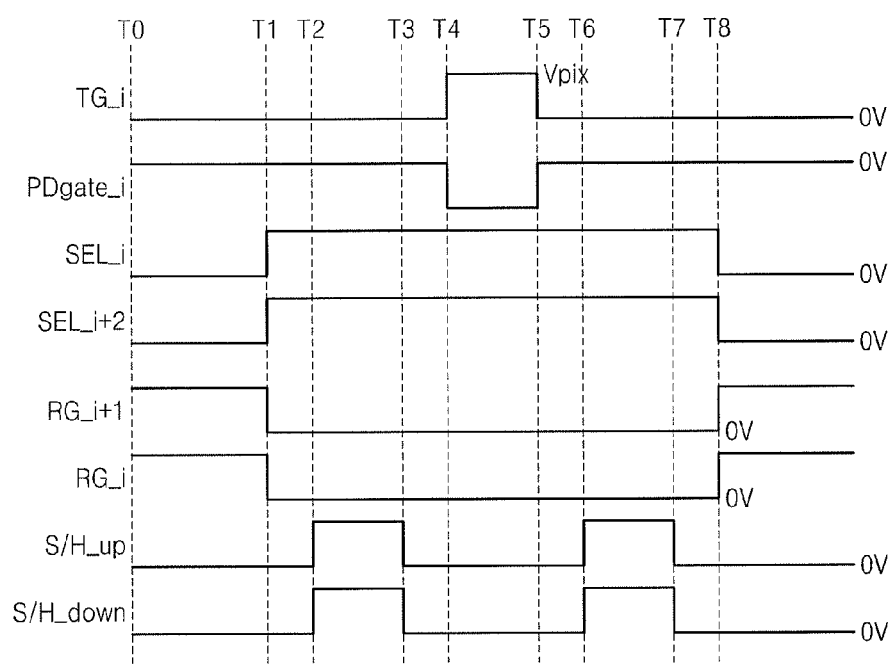
FIG. 18 illustrates a timing chart showing the operation of the pixel array illustrated in FIG. 17 according to some embodiments of the inventive concept.

FIG. 17 illustrates a diagram for explaining the operation of the pixel array 80 illustrated in FIG. 8. FIG. 18 is a timing chart showing the operation of the pixel array illustrated in FIG. 17 according to some embodiments of the inventive concept. The CDS operation of a complementary metal oxide semiconductor (CMOS) image sensor according to some embodiments of the inventive concept will be described with reference to FIGS. 17 and 18.

At a time point T0, reset signals RG_i+1 and RG_i are at a logic high and a photo gate resets a pair of symmetric floating sensing nodes in each pixel in a row controlled by a control signal PDgate_i+1.

At a time point T1, the reset signals RG_i+1 and RG_i transition to a logic low and selection signals SEL_i and SEL_i+2 transition to a logic high, so that reset values for CDS are generated. The reset values are sampled in a period between time points T2 and T3, that is, a logic high period of sampling signals S/H_up and S/H_down.

The sampling signals S/H_up and S/H_down may be interpreted as an analog-to-digital conversion (ADC) start signal or a signal for temporarily storing ADC values in a sample and hold circuit according to a method of reading a reset value. The sampling signals S/H_up and S/H_down may be differently interpreted according to the type of CDS, e.g., analog CDS, digital CDS, or dual CDS.

Meanwhile, a photodiode collects light since or since before the time point T0. Photocharge generated from the light collected in the photodiode through photoelectric conversion is transferred to the pair of floating sensing nodes by a control signal TG_i transitioning to a logic high at a time point T4.

A difference in the amount of photocharge between the floating sensing nodes may occur due to an impurity concentration profile of the floating sensing nodes or the photodiode or other characteristics. Even though such difference occurs, there would be no problem in an output value of pixel data using pixels according to embodiments because the amounts of photocharge output in two directions from the photodiode are summed up eventually.

During a period between time points T4 and T5, the photocharge generated in the photodiode is output. At this time, a negative voltage may be applied to the photo gate in order to increase photo transfer efficiency. During the period between time points T4 and T5, a control signal PDgate_i has a negative value.

Output values are sampled by sampling signals S/H_up and S/H_down during a period between time points T6 and T7. The period between time points T6 and T7 is the same as the period between time points T2 and T3. The operation during these periods may be different depending on a CDS mode and an image sensor driving method.

When the selection signals SEL_i and SEL_i+2 transition to a logic low at a time point T8, the CDS operation on the current row is completed and the reset signals RG_i+1 and RG_i transition to the logic high, by which a reset operation is carried out for the data output of the next frame.

FIGS. 19A through 19D illustrate detailed circuit diagrams of various examples of a unit pixel. A photodiode illustrated therein may include at least one of a photo transistor, a photo gate, a pinned photodiode (PPD), and a combination thereof.

Figure 19A:
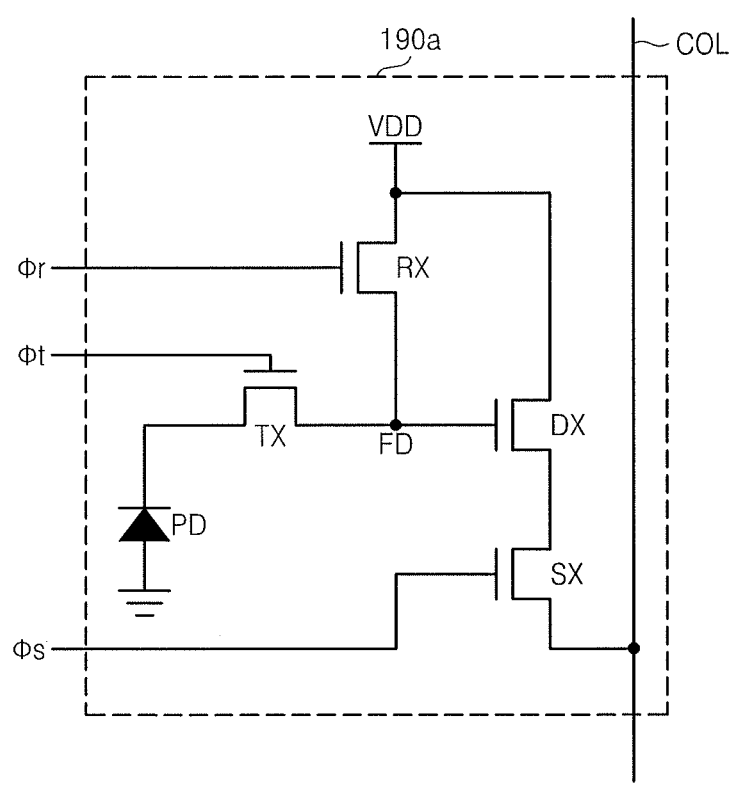
FIGS. 19A through 19D illustrate detailed circuit diagrams of examples of a pixel.

Referring to FIG. 19A, a unit pixel 190a includes a photodiode PD, a transfer transistor TX, a floating sensing node FD, a reset transistor RX, a drive transistor DX, and a select transistor SX. The transfer transistor TX operates in response to a transfer control signal φt, the reset transistor RX operates in response to a reset control signal φr and the select transistor SX operates in response to a selection signal φs.

FIG. 19A shows a 4-transistor (4T) structure that includes a single photodiode PD and four MOS transistors TX, RX, DX, and SX, but the present invention is not restricted to this example. Any circuits including at least three transistors including the drive transistor DX and the select transistor SX and the photodiode PD may be used in the embodiments of the present invention.

Figure 19B:
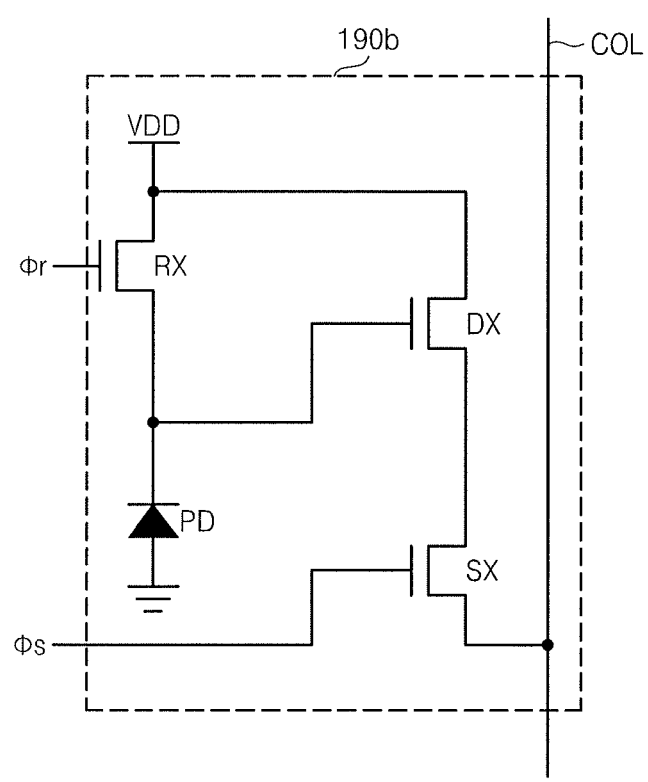

Referring to FIG. 19B, a unit pixel 190b has a 3-transistor (3T) structure that includes the photodiode PD, the reset transistor RX, the drive transistor DX, and the select transistor SX, but no transfer transistor TX.

Figure 19C:
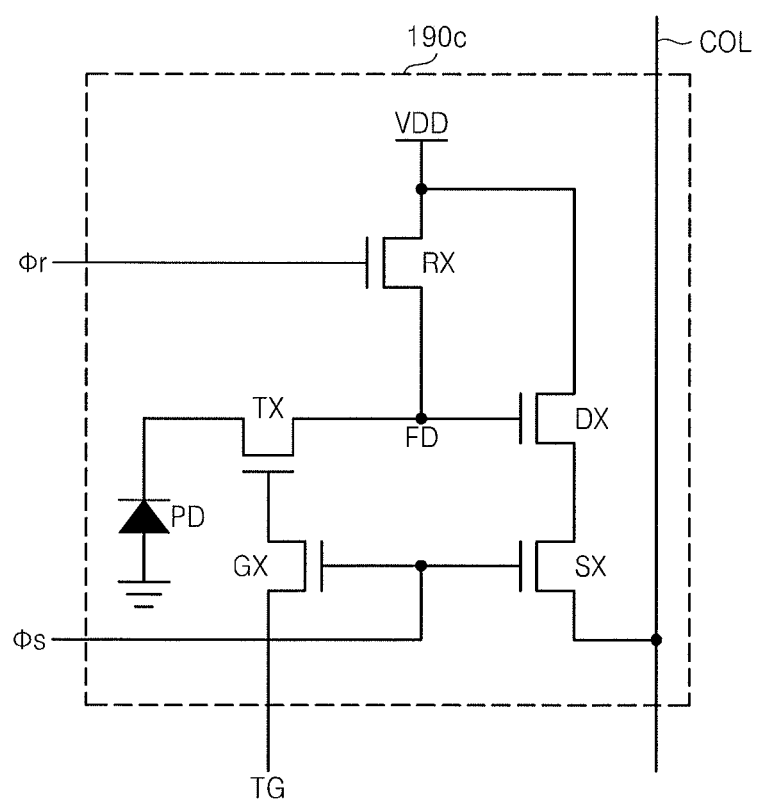

Referring to FIG. 19C, a unit pixel 190c has a 5-transistor (5T) structure that includes the photodiode PD, the transfer transistor TX, the reset transistor RX, the drive transistor DX, the select transistor SX, and one more transistor GX.

Figure 19D:
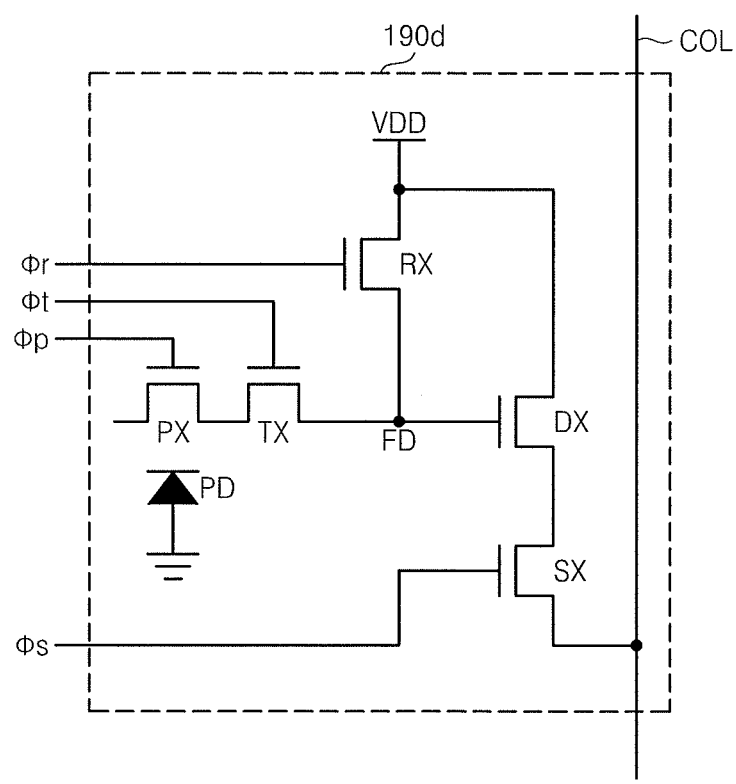

Referring to FIG. 19D, a unit pixel 190d has a 5T structure that includes the photodiode PD, the transfer transistor TX, the reset transistor RX, the drive transistor DX, the select transistor SX, and one more transistor PX. The transistor PX operates in response to a control signal 4.

Figure 20:
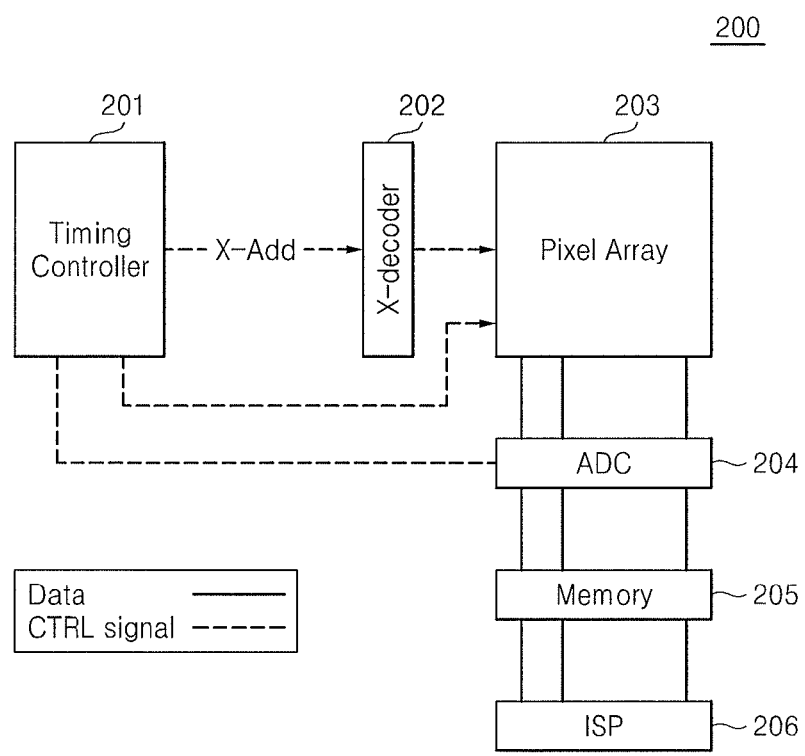
FIG. 20 illustrates a diagram of an image sensor according to some embodiments of the inventive concept.

FIG. 20 illustrates a diagram of an image sensor 200 according to some embodiments of the inventive concept. Referring to FIG. 20, the image sensor 200 converts an optical signal into an electrical signal. A timing controller 201 controls the operation timing of the image sensor 200.

The timing controller 201 may control a light collection time of the image sensor 200 using a transfer gate control signal. The image sensor 200 includes a pixel array 203, an analog-to-digital converter (ADC) 204, a row address decoder 202, a memory 205, and an image signal processor (ISP) 206. The pixel array 203 includes the structure and the operations described with reference to any one of FIGS. 1 through 19D, and has an improved sensitivity long wavelengths, e.g., red in the visible spectrum, according to the CRA characteristic.

The ADC 204 converts an analog signal from the pixel array 203 into a digital signal. The memory 205 may be referred to as a buffer memory or a frame memory. The memory 205 may store the digital signal in frame units.

The ISP 206 performs signal processing using a digital image signal stored in the memory 205. The signal processing may include color interpolation, color correction, auto white balance, gamma correction, color saturation correction, formatting, bad pixel correction, and/or hue correction.

The row address decoder 202 controls the operation (or output) timing of each row in the pixel array 203 using address information X-Add provided from the timing controller 201. The ADC 204 may have a different structure depending on the type of CDS, i.e., analog CDS, digital CDS, or dual CDS. The ADC 204 may be implemented using a column ADC provided for each column in the image sensor 200 or as a single ADC.

Figure 21:
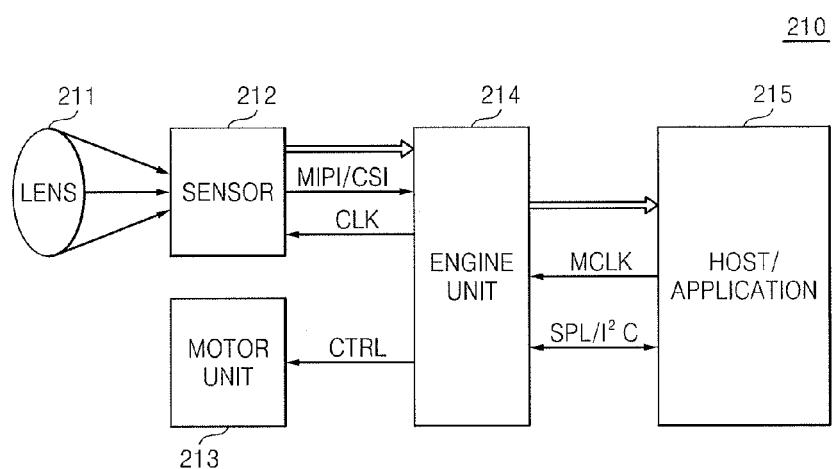
FIG. 21 illustrates a block diagram of a camera system according to some embodiments of the inventive concept.

FIG. 21 illustrates a block diagram of a camera system 210 according to some embodiments of the inventive concept. The camera system 210 may include a digital camera.

Referring to FIG. 21, the camera system 210 may include a lens 211, an image sensor 212, a motor unit 213, and an engine unit 214. A pixel array of the image sensor 212 may include floating sensing nodes symmetrically arrange in pair with respect to a photodiode, which have been described with reference to FIGS. 1 through 19D.

The lens 211 focuses incident light onto a light receiving area (e.g., a photodiode) in the image sensor 212. The image sensor 212 generates image data based on the incident light received through the lens 211. The image sensor 212 may provide the image data based on a clock signal CLK.

The image sensor 212 may interface with the engine unit 214 using a mobile industry processor interface (MIPI) and/or a camera serial interface (CSI). The motor unit 213 may adjust the focus of the lens 211 in response to a control signal CTRL received from the engine unit 214 or perform shuttering.

The engine unit 214 controls the image sensor 212 and the motor unit 213. The engine unit 214 may generate YUV data including a distance to an object, a luminance component, a difference between the luminance component and a blue component, and a difference between the luminance component and a red component or compressed data, e.g., Joint Photography Experts Group (JPEG) data, based on distance and/or image data received from the image sensor 212.

The engine unit 214 may be connected to a host/application processor 215 and may provide the YUV data or JPEG data to the host/application processor 215 based on a master clock signal MCLK. In addition, the engine unit 214 may interface with the host/application processor 215 using a serial peripheral interface (SPI) and/or an inter integrated circuit ($I^2C$).

Figure 22:
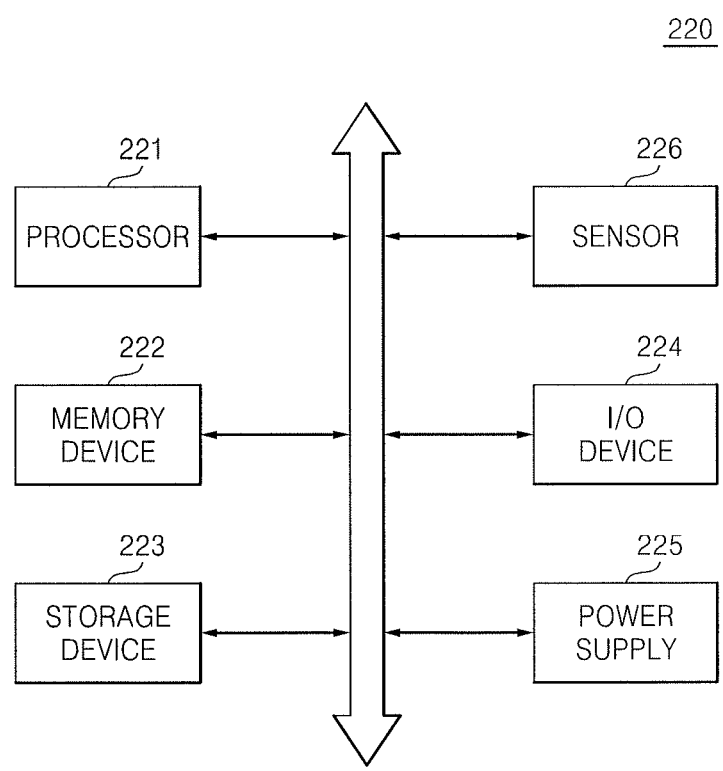
FIG. 22 illustrates a block diagram of a computing system according to some embodiments of the inventive concept.

FIG. 22 illustrates a block diagram of a computing system 220 according to some embodiments of the inventive concept. Referring to FIG. 22, the computing system 220 may include a processor 221, a memory device 222, a storage device 223, an input/output (I/O) device 224, a power supply 225, and an image sensor 226. A pixel array of the image sensor 226 may include the structure described with reference to FIGS. 1 through 19D.

Although not shown in FIG. 22, the computing system 220 may also include ports that can communicate with video cards, sound cards, memory cards, universal serial bus (USB) devices, or other electronic devices.

The processor 221 may perform particular calculations or tasks. The processor 221 may include a microprocessor or a central processing unit (CPU). The processor 221 may communicate with the memory device 222, the storage device 223, and the I/O device 224 through an address bus, a control bus, and a data bus.

The processor 221 may also be connected to an extended bus such as a peripheral component interconnect (PCI) bus. The memory device 222 may store data necessary for the operations of the computing system 220. The memory device 222 may be implemented by dynamic random access memory (DRAM), mobile DRAM, static RAM (SRAM), flash memory, phase-change RAM (PRAM), ferroelectric RAM (FRAM), resistive RAM (RRAM) and/or magnetoresistive RAM (MRAM).

The storage device 223 may include a solid state drive (SSD), a hard disk drive (HDD), and a compact disk-read only memory (CD-ROM).

The I/O device 224 may include an input device such as a keyboard, a keypad, or a mouse and an output device such as a printer or a display. The power supply 225 may provide an operating voltage necessary for the operation of the computing system 220.

The image sensor 226 may communicate with the processor 221 through buses or other communication links. The image sensor 226 and the processor 221 may be integrated together into a single chip or may be separately integrated into different chips, respectively.

The computing system 220 may be any type of computing system using the image sensor 226. For instance, the computing system 220 may include a digital camera, a cellular phone, a personal digital assistant (PDA), a portable multimedia player (PMP), or a smart phone.

Figure 23:
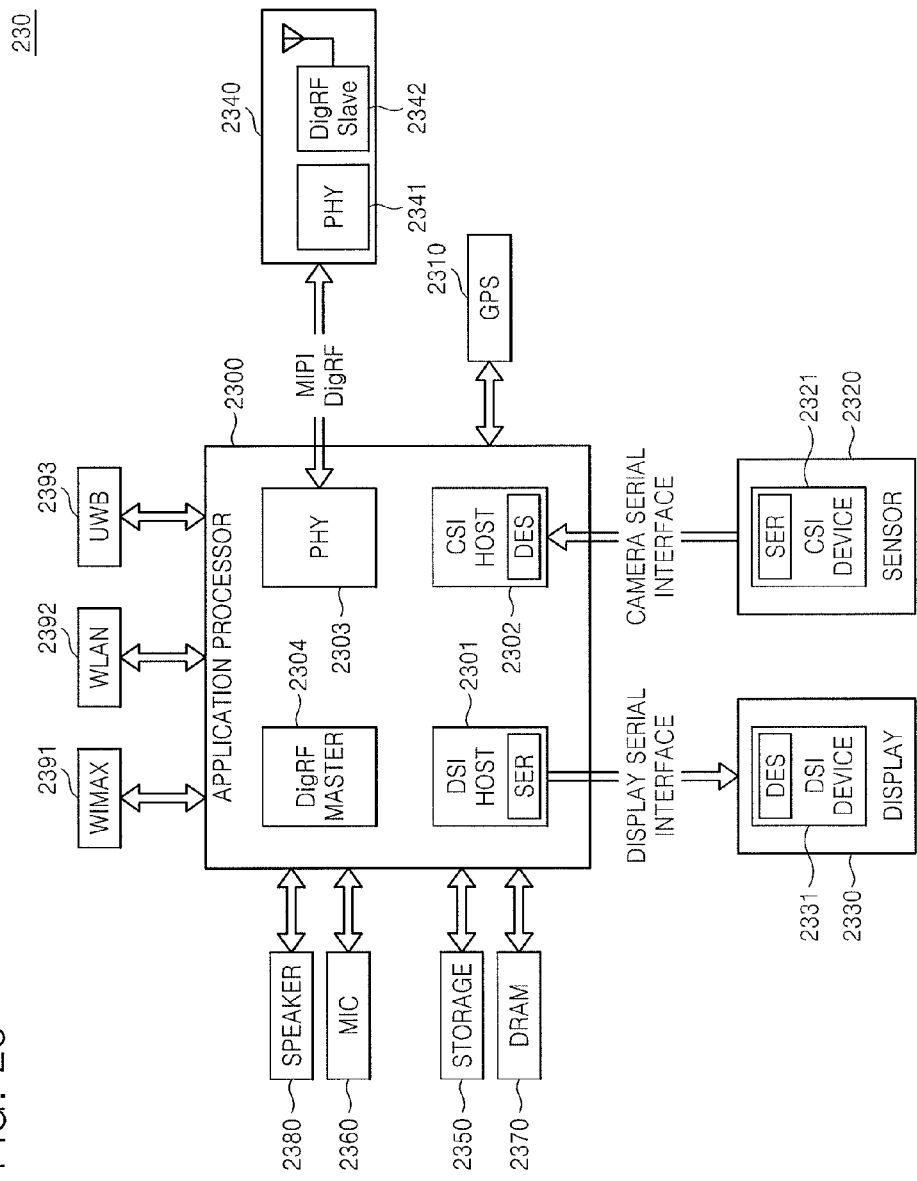
FIG. 23 illustrates a block diagram of a computing system according to some embodiments of the inventive concept.

FIG. 23 illustrates a block diagram of a computing system according to some embodiments of the inventive concept. Referring to FIG. 23, the computing system 230 may be implemented as a data processing device that can use or support MIPI®. The computing system 230 may include an application processor 2300, an image sensor 2320, and a display 2330.

A camera serial interface (CSI) host 2302 included in the application processor 2300 may perform serial communication with a CSI device 2321 included in the image sensor 2320 through CSI. The CSI host 2302 may include a deserializer DES and the CSI device 2321 may include a serializer SER. A pixel array of the image sensor 2320 may include the structure described with reference to any one of FIGS. 1 through 19D.

A display serial interface (DSI) host 2301 included in the application processor 2300 may perform serial communication with a DSI device 2331 included in the display 2330 through DSI. The DSI host 2301 may include a serializer SER and the DSI device 2331 may include a deserializer DES.

The computing system 230 may also include a radio frequency (RF) chip 2340 communicating with the application processor 2300. The RF chip 2340 includes a physical layer (PHY) 2341 and a DigRF slave 2342.

A PHY 2303 of the application processor 2300 and the PHY 2341 of the RF chip 2340 may communicate data with each other according to MIPI DigRF. The application processor 2300 may also include a DigRF master 2304 that controls data communication of the PHY 2303 using MIPI DigRF.

The computing system 230 may further include a global positioning system (GPS) receiver 2310, a storage 2350, a microphone (MIC) 2360, a DRAM 2370, and a speaker 2380. The computing system 230 may communicate using an ultra-wideband (UWB) 2393, a wireless local area network (WLAN) 2392, and a worldwide interoperability for microwave access (Wimax) 2391. The structure and interface of the computing system 230 illustrated in FIG. 23 is just an example, and embodiments are not limited thereto.

According to some embodiments, a sensitivity difference occurring for light having a long wavelength due to a CRA difference depending on a pixel position in a CMOS image sensor is reduced. In addition, a negative voltage may be applied to a photodiode through a photo gate during the transfer of photocharge, thereby improving a lag characteristic.

In detail, at least a pair of floating sensing nodes are arranged adjacent opposing portions of a photodiode, e.g., symmetrically with respect to a photodiode, thereby reducing sensitivity difference occurring for color light having a long wavelength according to a CRA depending on a pixel position. In addition, a photo gate may be provided in a path between the photodiode and incident light or off the path, so that a negative voltage is applied to the photodiode when photocharge generated in the photodiode is transferred to the floating sensing nodes, thereby increasing optical transfer efficiency and improving the lag characteristic.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pixel of an image sensor, the pixel comprising:
    a photodiode configured to convert an optical signal into a photocharge;
    at least two sensing nodes configured to sense the photocharge, the at least two sensing nodes being arranged symmetrically with respect to the photodiode; and
    a driver configured to convert the sensed photocharge into an electrical signal.

2. The pixel as claimed in claim 1, further comprising a photo gate configured to apply a negative voltage to the photodiode when the photocharge is transferred from the photodiode to the at least two sensing nodes.

3. The pixel as claimed in claim 2, wherein the photo gate overlaps the photodiode.

4. The pixel as claimed in claim 3, wherein the photo gate is positioned in a path of light incident on the photodiode.

5. The pixel as claimed in claim 3, wherein the photo gate is positioned outside a path of light incident on the photodiode.

6. The pixel as claimed in claim 1, wherein the driver comprises at least two transfer transistors respectively adjacent to the at least two sensing nodes and the at least two transfer transistors are on-off controlled simultaneously.

7. The pixel as claimed in claim 1, wherein the driver is adjacent to each of at least two sides of the photodiode.

8. The pixel as claimed in claim 7, further comprising a reset element adjacent to at least one side of the photodiode.

9. A pixel array of an image sensor, the pixel array comprising:
    a first pixel disposed in a first row, the first pixel including a first photodiode and at least two first sensing nodes symmetrically disposed with respect to the first photodiode and configured to sense a first photocharge generated by the first photodiode; and
    a second pixel disposed in a second row, the second pixel including a second photodiode and at least two second sensing nodes symmetrically disposed with respect to the second photodiode and configured to sense a second photcharge generated by the second photodiode,
    wherein the first pixel and the second pixel are adjacent to each other and share at least one of the at least two first sensing nodes and the at least two second sensing nodes with each other.

10. The pixel array as claimed in claim 9, wherein the first pixel and the second pixel are disposed in one column.

11. The pixel array as claimed in claim 10, wherein each of the first pixel and the second pixel includes at least two drivers configured to convert charge received from the at least two first or second sensing nodes into an electrical signal, and at least one of the at least two drivers is shared by the first pixel and the second pixel.

12. The pixel array as claimed in claim 10, wherein each of the first pixel and the second pixel includes a reset element configured to reset the at least two first or second sensing nodes, and the first pixel and the second pixel share the reset element with each other.

13. The pixel array as claimed in claim 9, wherein each of the first pixel and the second pixel is a color pixel comprising a luminance component.

14. The pixel array as claimed in claim 13, wherein each of the first pixel and the second pixel includes one of a green pixel and a white pixel.

15. The pixel array as claimed in claim 9, wherein each of the first pixel and the second pixel is a pixel includes a hue component.

16. A pixel of an image sensor, the pixel comprising:
a photodiode configured to convert an optical signal into photocharge;
at least two sensing nodes configured to sense the photocharge, the at least two sensing nodes being adjacent opposing portions of the photodiode; and
a driver configured to convert the sensed photocharge into an electrical signal, wherein
the driver includes at least two drivers, and the at least two sensing nodes are connected to corresponding drivers, respectively.

17. The pixel as claimed in claim 16, further comprising insulating layers adjacent different opposing portions of the photodiode and between adjacent sensing nodes.

18. The pixel as claimed in claim 16, wherein the photodiode is a polygon and the opposing portions are vertices of the polygon.

19. The pixel as claimed in claim 16, wherein the photodiode is a polygon and the opposing portions are sides of the polygon.

20. The pixel as claimed in claim 16, further comprising a photo gate configured to apply a negative voltage to the photodiode when the photocharge is transferred from the photodiode to the at least two sensing nodes.

* * * * *